United States Patent
Lee et al.

(10) Patent No.: US 8,547,709 B2
(45) Date of Patent: Oct. 1, 2013

(54) ELECTRONIC SYSTEM WITH A COMPOSITE SUBSTRATE

(75) Inventors: Han-Hsiang Lee, Taipei (TW); Kun-Hong Shih, Hsinchu (TW); Jeng-Jen Li, Taipei (TW)

(73) Assignee: Cyntec Co. Ltd., Hsinchu (TW)

( * ) Notice: Subject to any disclaimer, the term of this patent is extended or adjusted under 35 U.S.C. 154(b) by 385 days.

(21) Appl. No.: 12/705,389

(22) Filed: Feb. 12, 2010

(65) Prior Publication Data

US 2011/0199746 A1 Aug. 18, 2011

(51) Int. Cl.
*H05K 5/02* (2006.01)
*H05K 7/00* (2006.01)

(52) U.S. Cl.
USPC ........... 361/813; 361/723; 361/709; 174/536; 174/538

(58) Field of Classification Search
USPC ............ 361/813, 723, 704, 688, 539, 679.47, 361/679.54, 697, 701, 702, 709; 174/536, 174/538, 535; 257/666
See application file for complete search history.

(56) References Cited

U.S. PATENT DOCUMENTS

| | | | | |
|---|---|---|---|---|
| 5,083,189 A * | 1/1992 | Sawaya | ........................ | 257/791 |
| 5,362,984 A * | 11/1994 | Konda et al. | .................. | 257/666 |
| 6,313,520 B1 | 11/2001 | Yoshida et al. | | |
| 2002/0149094 A1 | 10/2002 | Sakabe | | |
| 2003/0096456 A1* | 5/2003 | Yasunaga et al. | ............. | 438/124 |
| 2006/0220188 A1* | 10/2006 | Liu et al. | ........................ | 257/666 |
| 2007/0196950 A1* | 8/2007 | Shirai et al. | .................. | 438/106 |
| 2008/0012099 A1* | 1/2008 | Yeh et al. | ....................... | 257/666 |
| 2009/0091013 A1* | 4/2009 | Fukuda et al. | ................ | 257/676 |

FOREIGN PATENT DOCUMENTS

JP 63197362 A 8/1988

* cited by examiner

*Primary Examiner* — Hoa C Nguyen
(74) *Attorney, Agent, or Firm* — Lowe, Hauptman & Ham

(57) ABSTRACT

A composite substrate made of a circuit board mounted on a lead frame is used for an electronic system package. High heat generated electronic components are adapted to mount on the lead frame and relatively low heat generated electronic components are adapted to mount on the circuit board. Metal lines are used for electrical coupling between the circuitry of the IC chip and the circuit board. An electronic system with the composite substrate gains both advantages—good circuitry arrangement capability from the circuit board and good heat distribution from the lead frame.

19 Claims, 11 Drawing Sheets

(US 6,212,086)

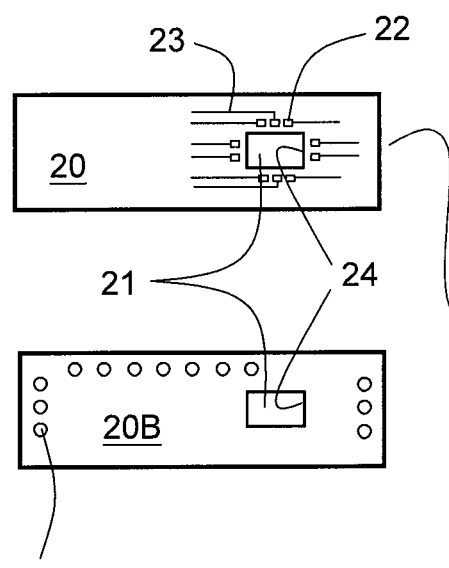
Fig. 2A
Fig. 2B
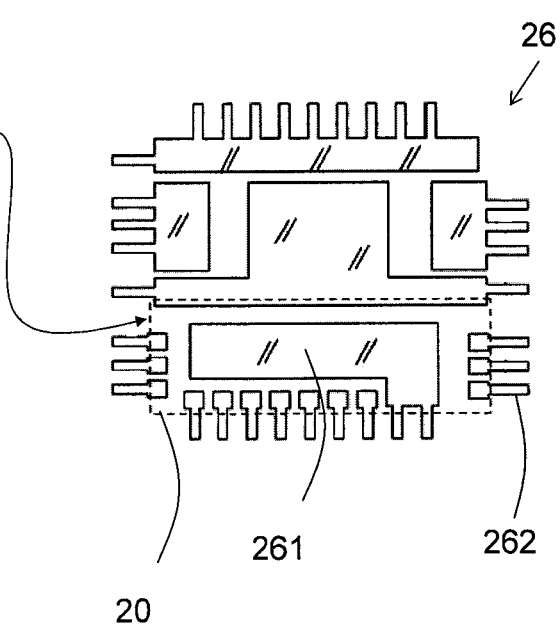
Fig. 2C

Fig. 4C
Fig. 4D
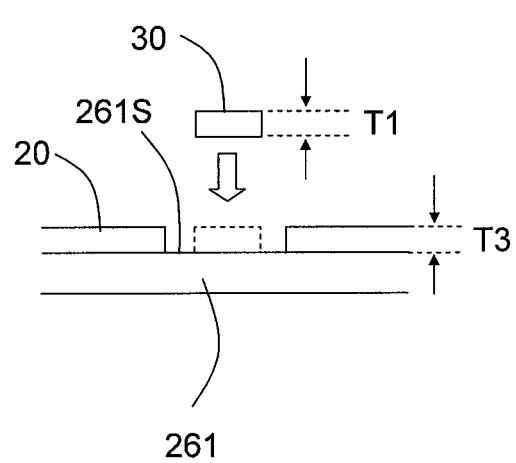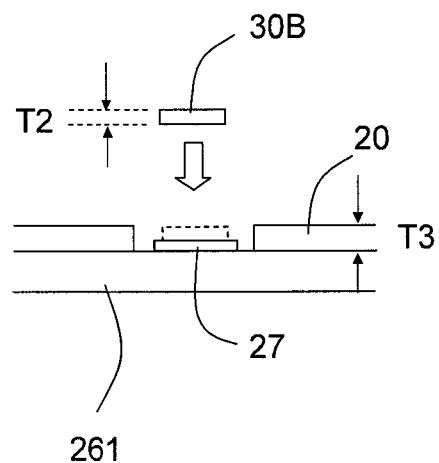

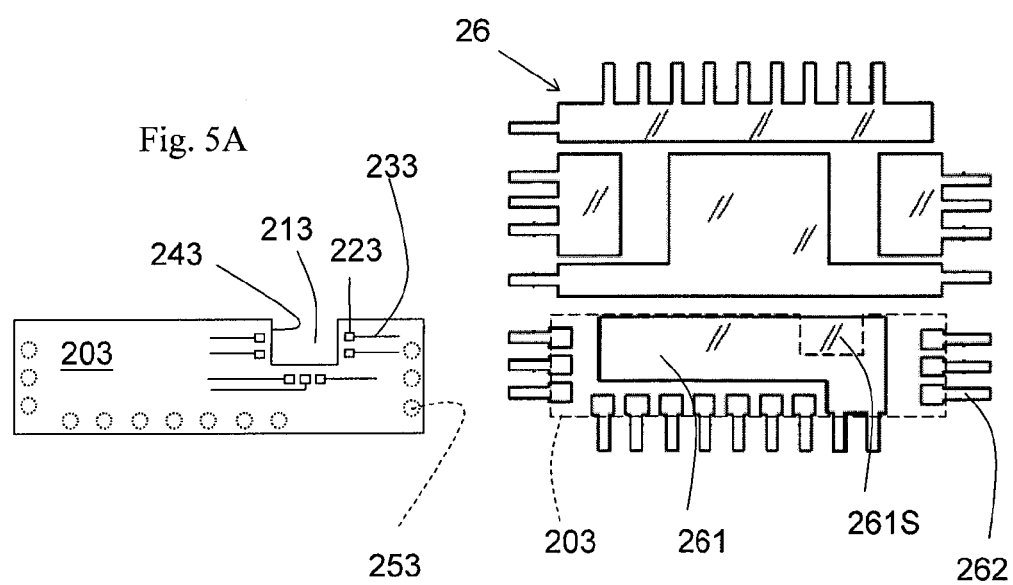

ELECTRONIC SYSTEM WITH A COMPOSITE SUBSTRATE

FIELD OF THE INVENTION

1. Field of the Invention

This invention relates to an electronic system with a composite substrate which is composed of a circuit board mounted on a lead frame.

2. Background

FIG. 1 is a prior art

FIG. 1 shows a prior art U.S. Pat. No. 6,212,086, it discloses a DC-to-DC converter system which includes a copper clad 110 on bottom for equal heat distribution. The prior art also includes a circuit board 120 mounted on the top surface of the copper clad 110. Electronic components including main transformer 130, output inductor 140, synchronous rectifiers 150, output capacitors 160, and input capacitors 170 are all mounted on the circuit boards 120. A discrete output connector is connected to the circuit board 120 through a flexible circuit board in the right side of the package.

However, one of the main disadvantages is that the circuit board 120 is not a good heat conductor for transferring the heat generated from the electronic components 120, 130, 140, 150, 160, and 170 downward to the copper clad 110. A circuit board is good for circuitry arrangement capability but not good for heat distribution for heat generating electronic components; while in contrast, a copper clad is good for heat distribution but not good for circuitry arrangement as compared to a circuit board. Persons skilled in the art have been striving for developing a substrate which displays both advantages—larger circuitry arrangement capability and good heat distribution capability.

BRIEF DESCRIPTION OF THE DRAWING

FIG. 2A is a top view of a circuit board used in the first embodiment according to the present invention FIG. 2B is a bottom view of FIG. 2A.

FIG. 2C is a lead frame used in the first embodiment according to the present invention.

FIG. 4C is an enlarged section view according to line AA' in FIG. 4A.

FIG. 4D is another enlarged section view according to line AA' in FIG. 4A.

FIG. 5A is a top view of a circuit board used in the second embodiment according to the present invention FIG. 5B is a lead frame used in the second embodiment according to the present invention.

DETAILED DESCRIPTION OF THE INVENTION

Figure 1:
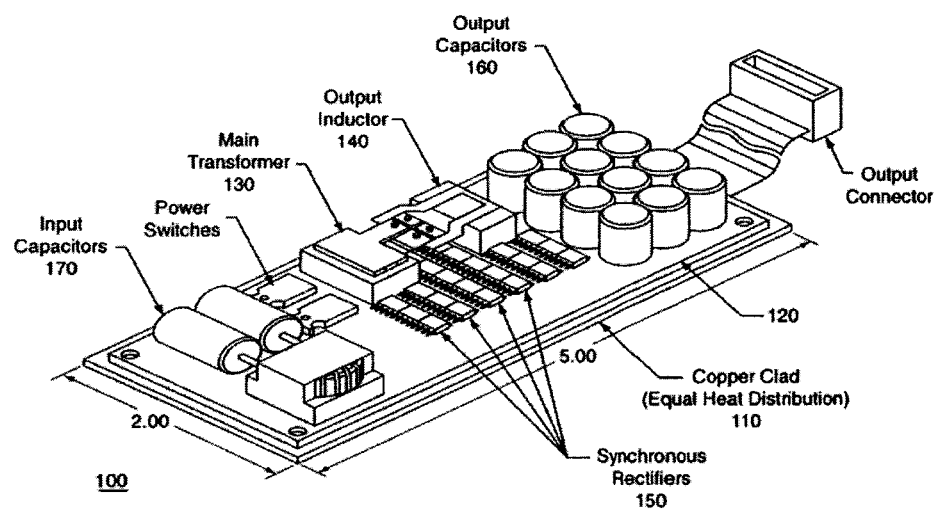
FIG. 1 is a prior art.

A composite substrate consisted of a circuit board mounted on a lead frame is used for a DC-to-DC converter system package. High heat generated electronic components such as an integrated circuit (IC) chip are mounted on the lead frame and relatively low heat generated electronic components are mounted on the circuit board. Metal lines are used for electrical coupling between the circuitry of the IC chip and the circuit board. An electronic system with the composite substrate gains both advantages—good circuitry arrangement capability from the circuit board and good heat distribution from the lead frame.

FIG. 2A is a top view of a circuit board used in the first embodiment according to the present invention FIG. 2A shows a circuit board 20 having a rectangular opening 21, a plurality of metal pads 22 surrounds the four sides 24 of the rectangular opening 21. The metal pads 22 are part of the circuitry (not shown) of the circuit board 20 and electrically couple to the circuitry of the circuit board 20 through metal lines 23.

FIG. 2B is a bottom view of FIG. 2A.

A plurality of bottom metal contacts 25 electrically coupling to the circuitry (not shown) of the circuit board 20 are made on bottom side 20B of the circuit board 20.

FIG. 2C is a lead frame used in the first embodiment according to the present invention.

A lead frame 26 has several large metal areas 261 adapted for carrying electronic components and a plurality of peripheral metal leads 262 distributes along the periphery of the lead frame 26 as the input/output leads for the system package. The circuit board 20 is going to be mounted on top side of the lead frame 26.

Figure 3:
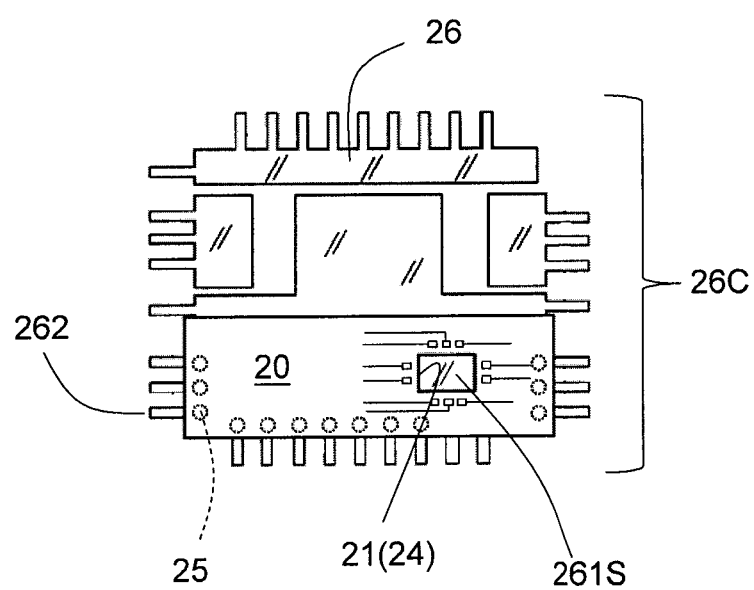
FIG. 3 is the first composite substrate used in the first embodiment according to the present invention.

FIG. 3 is the first composite substrate used in the first embodiment according to the present invention.

The circuit board 20 of FIG. 2A is mounted on top of the lead frame 26 of FIG. 2C to form a first composite substrate 26C according to the present invention. Each of the bottom metal contacts 25 on the bottom side 20B of the circuit board 20 electrically couples to one of the peripheral metal leads 262 of the lead frame 26. The rectangular opening 21 of the circuit board 20 exposes metal surface 261S which is a partial surface of one of the large metal areas 261.

Figure 4A:
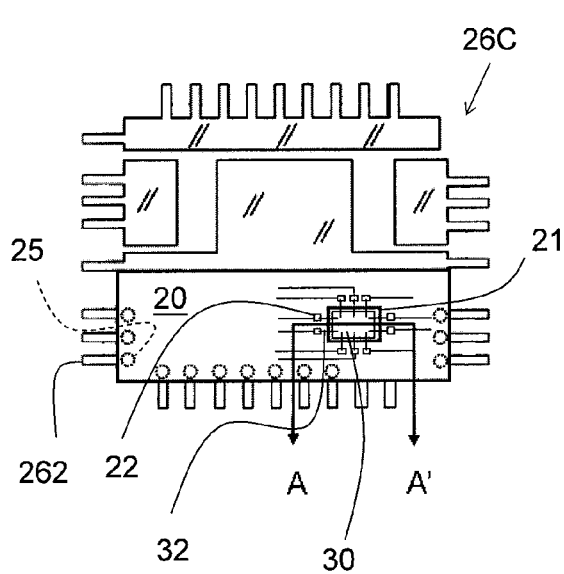
FIG. 4A is a top view of a first embodiment according to the present invention.

FIG. 4A is a top view of a first embodiment according to the present invention.

An IC chip 30 is mounted on the exposed metal surface 261S within the rectangular opening 21 of the circuit board 20. The circuitry (not shown) of the IC chip 30 electrically couples to the circuitry (not shown) of the circuit board 20 through metal wires 32 which electrically couple the metal pads 22 on the circuit board 20 to top metal contacts of the IC chip 30. The rectangular opening 21 has its four sides 24 neighboring to the four sides of the IC chip 30, this configuration gives four sides electrical coupling capacity for the circuitry coupling between the IC chip 30 and the circuit board 20.

Figure 4B:
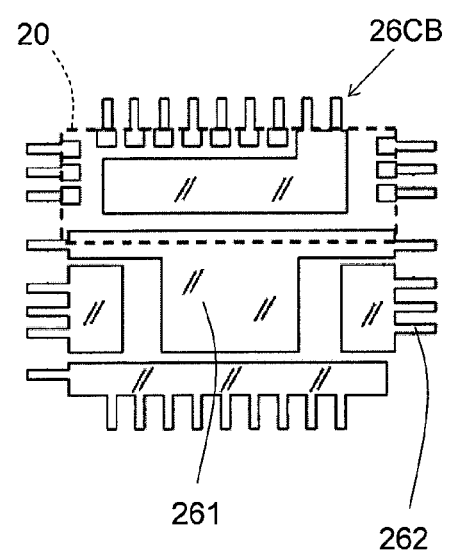
FIG. 4B is a bottom view of FIG. 4A.

FIG. 4B is a bottom view of FIG. 4A.

FIG. 4B is a bottom view of FIG. 4A. The bottom side 26CB of the composite substrate 26C as shown in FIG. 4A shows that the bottom surface of the large metal areas 261 and the bottom surface of the peripheral metal leads 262 of the lead frame 26 are coplanar.

FIG. 4C is an enlarged section view according to line AA' in FIG. 4A.

FIG. 4C shows an IC chip 30 is mounted on the metal surface 261S of one of the large metal areas 261 of the lead frame 26. The IC chip 30 has a thickness T1 which equals to or nears to the thickness T3 of the circuit board 20. The fact that the top surface of the IC chip 30 made near to the top surface of the circuit board 20 facilitates the metal wire 32 electrical coupling between the top metal contacts of the IC chip 30 and the metal pads 22 of the circuit board 20.

FIG. 4D is another enlarged section view according to line AA' in FIG. 4A.

FIG. 4D shows an IC chip 30B is mounted on a mat 27. The mat 27 is used when the IC chip 30B has a thickness T2 which is far below the thickness T3 of the circuit board 20. The mat 27 is used to elevate the height of the thinner IC chip 30B so that to make the top surface of the IC chip 30B near to the top surface of the circuit board 20.

FIG. 5A is a top view of a circuit board used in the second embodiment according to the present invention.

FIG. 5A shows a circuit board 203 having a U-shape indentation 213 in the periphery of the circuit board 203. A plurality of metal pads 223 surrounds the three sides 243 of the U-shape indentation 213. The metal pads 223 are part of the circuitry (not shown) of the circuit board 203 and electrically couple to the circuitry of the circuit board 203 through metal lines 233. A plurality of bottom metal contacts 253 electrically coupling to the circuitry (not shown) of the circuit board 203 are made on bottom side of the circuit board 203.

FIG. 5B is a lead frame used in the second embodiment according to the present invention.

A lead frame 26 has several large metal areas 261 adapted for carrying electronic components and a plurality of peripheral metal leads 262 distributes along the periphery of the lead frame 26 as the input/output leads for the system package. The circuit board 203 is going to be mounted on top side of the lead frame 26.

Figure 5C:
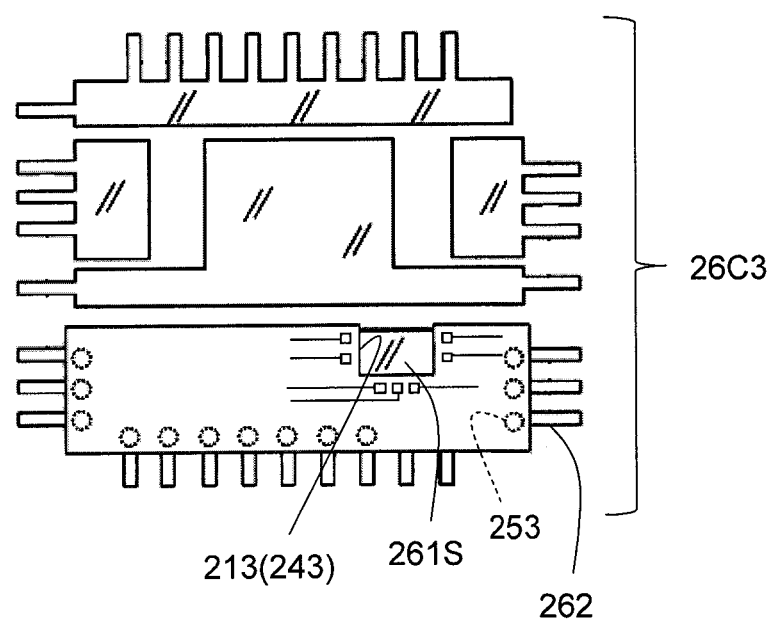
FIG. 5C is the second composite substrate used in the second embodiment according to the present invention.

FIG. 5C is the second composite substrate used in the second embodiment according to the present invention.

The circuit board 203 of FIG. 5A is mounted on top of the lead frame 26 of FIG. 5B to form a second composite substrate 26C3 according to the present invention. Each of the bottom metal contacts 253 on the bottom side of the circuit board 203 electrically couples to one of the peripheral metal leads 262 of the lead frame 26. The U-shape indentation 213 of the circuit board 203 exposes metal surface 261S which is a partial surface of one of the large metal areas 261.

Figure 5D:
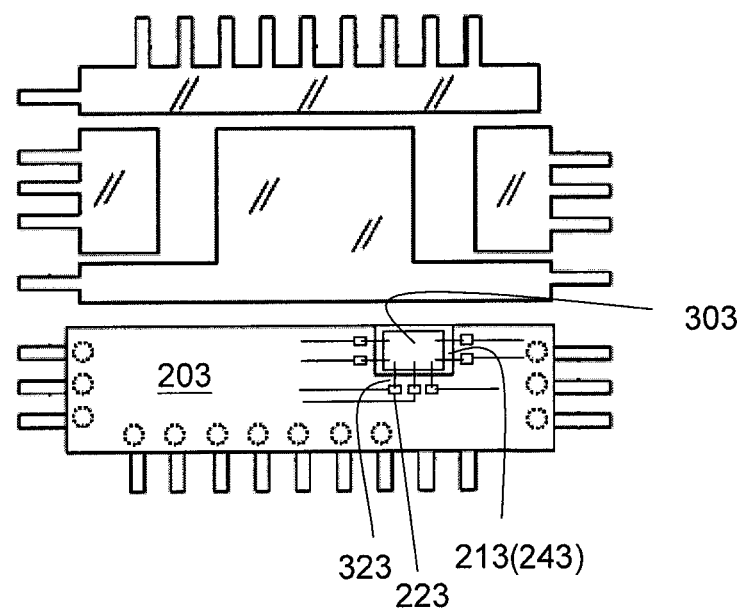
FIG. 5D is a top view of a second embodiment according to the present invention.

FIG. 5D is a top view of a second embodiment according to the present invention.

An IC chip 303 is mounted on the exposed metal surface 261S within the U-shape indentation 213 of the circuit board 203. The circuitry (not shown) of the IC chip 303 electrically couples to the circuitry (not shown) of the circuit board 203 through metal wires 323 which electrically couple the metal pads 223 on the circuit board 203 to top metal contacts of the IC chip 303. The U-shape indentation 213 has its three sides 243 neighboring to the three sides of the IC chip 303, this configuration gives three sides electrical coupling capacity for the circuitry coupling between the IC chip 303 and the circuit board 203.

Figures 6A, 6B:
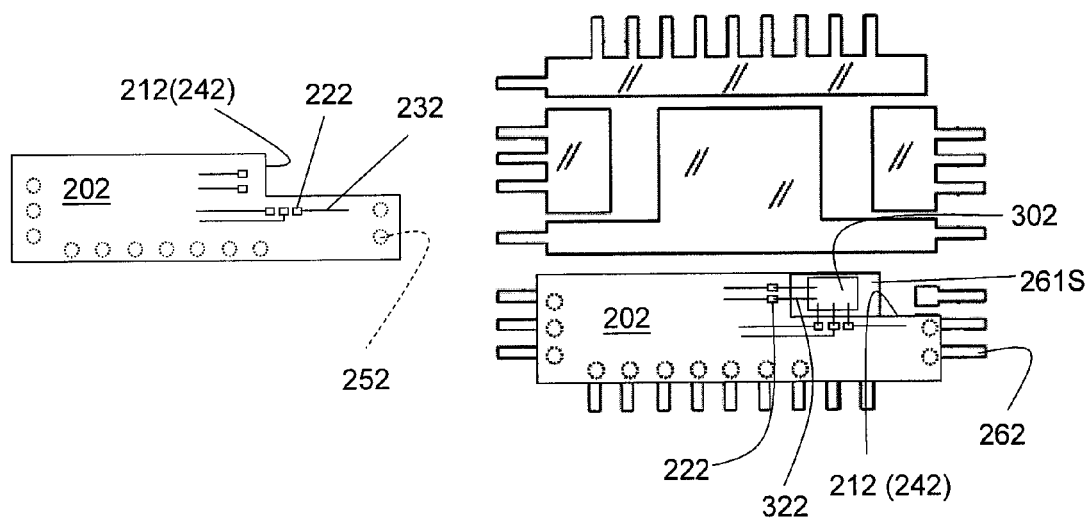
FIG. 6A is a top view of a circuit board used in the third embodiment according to the present invention
FIG. 6B is a top view of a third embodiment according to the present invention.

FIG. 6A is a top view of a circuit board used in the third embodiment according to the present invention.

FIG. 6A shows a circuit board 202 having an L-shape indentation 212 in the periphery of the circuit board 202. A plurality of metal pads 222 neighboring to the two sides 242 of the L-shape indentation 212. The metal pads 222 are part of the circuitry (not shown) of the circuit board 202 and electrically couple to the circuitry of the circuit board 202 through metal lines 232. A plurality of bottom metal contacts 252 electrically coupling to the circuitry (not shown) of the circuit board 202 are made on bottom side of the circuit board 202.

FIG. 6B is a top view of a third embodiment according to the present invention.

In this embodiment, basic concept is similar to previous embodiments; the only difference is that a circuit board 202 of FIG. 6A which has an L-shape indentation 212 is used. An IC chip 302 is mounted on the exposed metal surface 261S within the L-shape indentation 212 of the circuit board 202. The circuitry (not shown) of the IC chip 302 electrically couples to the circuitry (not shown) of the circuit board 202 through metal wires 322 which electrically couple the metal pads 222 on the circuit board 202 to top metal contacts of the IC chip 302. The L-shape indentation 212 has its two sides 242 neighboring to the two sides of the IC chip 302, this configuration gives two sides electrical coupling capacity for the circuitry coupling between the IC chip 302 and the circuit board 202.

Figures 7A, 7B:
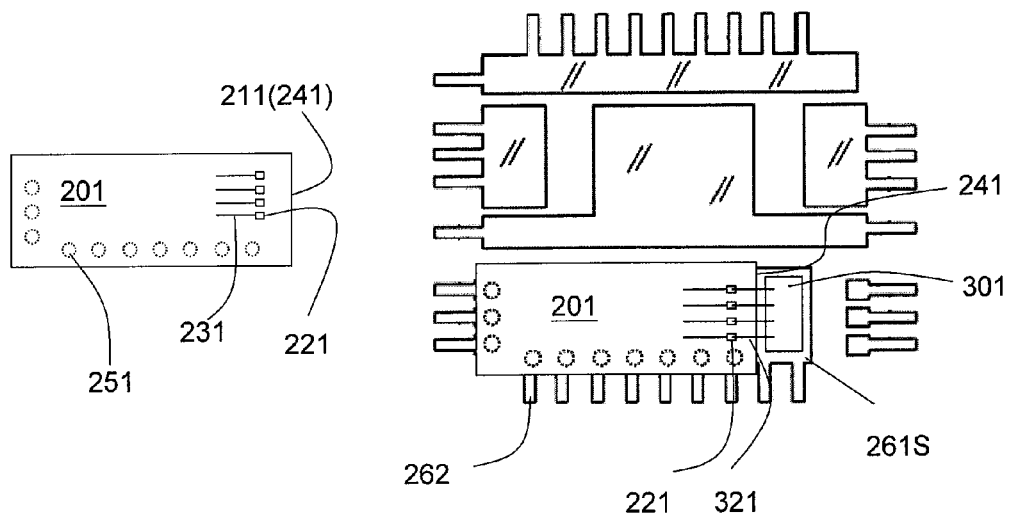
FIG. 7A is a top view of a circuit board used in the fourth embodiment according to the present invention
FIG. 7B is a top view of a fourth embodiment according to the present invention.

FIG. 7A is a top view of a circuit board used in the fourth embodiment according to the present invention FIG. 7A shows a circuit board 201 having a flat side 211 in the periphery of the circuit board 201. A plurality of metal pads 222 neighboring to the two sides 242 of the L-shape indentation 212. The metal pads 221 are part of the circuitry (not shown) of the circuit board 201 and electrically couple to the circuitry of the circuit board 201 through metal lines 231. A plurality of bottom metal contacts 251 electrically coupling to the circuitry (not shown) of the circuit board 201 are made on bottom side of the circuit board 201.

FIG. 7B is a top view of a fourth embodiment according to the present invention.

In this embodiment, basic concept is similar to previous embodiments; the only difference is that a circuit board 201 which has a flat side 241 is used. An IC chip 301 is mounted on the exposed metal surface 261S neighboring to the flat side 241 of the circuit board 201. The circuitry (not shown) of the IC chip 301 electrically couples to the circuitry (not shown) of the circuit board 201 through metal wires 321 which electrically couple the metal pads 221 on the circuit board 201 to top metal contacts of the IC chip 301. The flat side 241 neighbors to the single side of the IC chip 301, this configuration gives single side electrical coupling capacity for the circuitry coupling between the IC chip 301 and the circuit board 201.

Figures 8A, 8B:
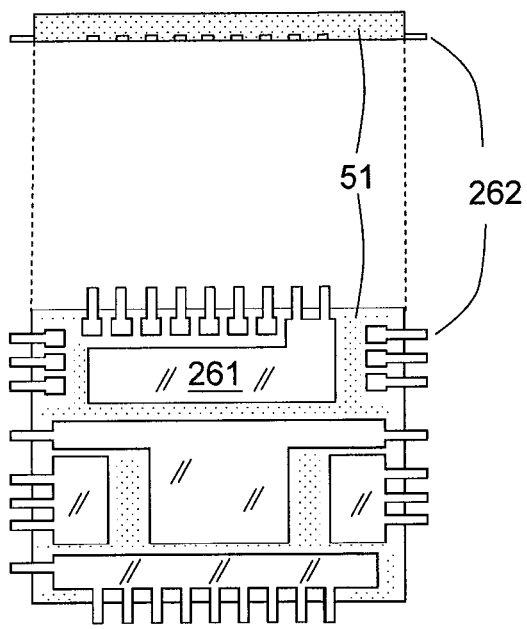
FIG. 8A is a side view of the system sealed by a molding compound according to the present invention.
FIG. 8B is a bottom view of the system sealed by a molding compound according to the present invention.

FIG. 8A is a side view of the system sealed by a molding compound according to the present invention.

FIG. 8A shows each of the packages of FIG. 4A, FIG. 5D, FIG. 6B and FIG. 7B sealed by a molding compound 51. The outer ends of the peripheral metal leads 262 protrude outside of the molding compound 51. The bottom surface of the molding compound 51 flushes the bottom surfaces of the peripheral leads 262.

FIG. 8B is a bottom view of the system sealed by a molding compound according to the present invention.

The bottom surface of the molding compound 51 flushes the bottom surfaces of the large metal areas 261 so that a flat bottom system is finished, in other words, a flat bottom surface mount system is finished.

While several embodiments have been described by way of example, it will be apparent to those skilled in the art that various modifications may be made without departing from the spirit of the present invention. Such modifications are all within the scope of the present invention, as defined by the appended claims.

What is claimed is:

1. An electronic system with a composite substrate, comprising:
   a lead frame having a plurality of metal leads;
   a circuit board mounted on said lead frame and having circuitry; and
   a chip mounted on said lead frame and electrically coupled to the circuitry of said circuit board;
   wherein the circuitry of said circuit board includes electronic components having lower heat generation than said chip;
   said lead frame further comprises a chip mounting metal area, said metal leads arranged along a periphery of said chip mounting metal area, each said metal lead spaced from said chip mounting metal area by a gap, said circuit board bridging the gap between each said metal lead and said chip mounting metal area, and said chip mounted on said chip mounting metal area; and
   said circuit board further comprises:
      opposite top and bottom surfaces;
      top contacts on the top surface, the top contacts overlapping said chip mounting metal area and electrically coupled to said chip and the circuitry of said circuit board; and
      bottom contacts on the bottom surface and electrically coupled to corresponding metal leads of said lead frame.

2. An electronic system as claimed in claim 1, wherein said system is a DC to DC converter system.

3. An electronic system as claimed in claim 2, further comprising:
   a molding compound having a bottom surface flush with bottom surfaces of said lead frame to form a flat bottom surface mount package.

4. An electronic system as claimed in claim 1, wherein said chip is disposed within an opening made through said circuit board.

5. An electronic system as claimed in claim 4, further comprising:
   a molding compound having a bottom surface flush with bottom surfaces of said lead frame to form a flat bottom surface mount package.

6. An electronic system as claimed in claim 1, wherein said chip is disposed within a U-shape indentation of said circuit board.

7. An electronic system as claimed in claim 6, further comprising:
   a molding compound having a bottom surface flush with bottom surfaces of said lead frame to form a flat bottom surface mount package.

8. An electronic system as claimed in claim 1, wherein said chip is disposed within an L-shape indentation of said circuit board.

9. An electronic system as claimed in claim 8, further comprising:
   a molding compound having a bottom surface flush with bottom surfaces of said lead frame to form a flat bottom surface mount package.

10. An electronic system as claimed in claim 1, wherein said chip is disposed neighboring to a side of said circuit board.

11. An electronic system as claimed in claim 10, further comprising:
    a molding compound having a bottom surface flush with bottom surfaces of said lead frame to form a flat bottom surface mount package.

12. An electronic system as claimed in claim 1, further comprising:
    a molding compound having a bottom surface flush with bottom surfaces of said lead frame to form a flat bottom surface mount package.

13. An electronic system as claimed in claim 1, further comprising:
    a mat disposed under said chip and elevating a top surface of said chip to be flush with a top surface of said circuit board.

14. An electronic system as claimed in claim 1, wherein the bottom contacts on the bottom surface of said circuit board are aligned, in plan view, with the corresponding metal leads of said lead frame.

15. An electronic system as claimed in claim 1, wherein said circuit board further comprises:
    conductive lines on the top surface of said circuit board and coupling the top contacts of said circuit board with the circuitry of said circuit board.

16. An electronic system as claimed in claim 15, wherein said chip comprises:
    opposite top and bottom surfaces, wherein the bottom surface of said chip is mounted on said lead frame; and
    top contacts on the top surface of said chip; and
    said system further comprises conductive wires coupling the top contacts on the top surface of said chip with the top contacts on the top surface of said circuit board, wherein said chip is electrically coupled to the circuitry of said circuit board via the conductive wires and the conductive lines on the top surface of said circuit board.

17. An electronic system with a composite substrate, comprising:
    a lead frame having a chip mounting metal area and a plurality of metal leads arranged along a periphery of said chip mounting metal area, each said metal lead spaced from said chip mounting metal area by a gap;
    a circuit board mounted on said lead frame and having circuitry, said circuit board bridging the gap between each said metal lead and said chip mounting metal area; and
    a chip mounted on said chip mounting metal area of said lead frame and electrically coupled to the circuitry of said circuit board;
    wherein said circuit board further comprises:
       opposite top and bottom surfaces;
       top contacts on the top surface, the top contacts overlapping said chip mounting metal area and electrically coupled to said chip and the circuitry of said circuit board; and
       bottom contacts on the bottom surface, the bottom contacts aligned with and coupled to corresponding metal leads of said lead frame.

18. An electronic system as claimed in claim 17, wherein said circuit board further comprises:
    conductive lines on the top surface of said circuit board and coupling the top contacts of said circuit board with the circuitry of said circuit board.

19. An electronic system as claimed in claim 18, wherein said chip comprises:
    opposite top and bottom surfaces, wherein the bottom surface of said chip is mounted on said lead frame; and
    top contacts on the top surface of said chip; and
    said system further comprises conductive wires coupling the top contacts on the top surface of said chip with the top contacts on the top surface of said circuit board, wherein said chip is electrically coupled to the circuitry of said circuit board via the conductive wires and the conductive lines on the top surface of said circuit board.

* * * * *